US008059480B2

(12) United States Patent
Lee et al.

(10) Patent No.: US 8,059,480 B2
(45) Date of Patent: Nov. 15, 2011

(54) SEMICONDUCTOR MEMORY DEVICE

(75) Inventors: Sung-Yeon Lee, Gyeonggi-do (KR); Young-Hoon Oh, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 134 days.

(21) Appl. No.: 12/488,632

(22) Filed: Jun. 22, 2009

(65) Prior Publication Data
US 2010/0277975 A1    Nov. 4, 2010

(30) Foreign Application Priority Data
Apr. 30, 2009  (KR) .................. 10-2009-0038532

(51) Int. Cl.
*G11C 7/02* (2006.01)
(52) U.S. Cl. ............... 365/209; 365/210.1; 365/210.14; 365/189.08; 365/210.13; 365/210.15; 365/213; 365/214
(58) Field of Classification Search .............. 365/209, 365/210.1, 210.14, 189.08, 210.13, 210.15, 365/213, 214
See application file for complete search history.

(56) References Cited

U.S. PATENT DOCUMENTS

| | | | |
|---|---|---|---|
| 6,111,781 A | 8/2000 | Naji | |
| 6,426,907 B1 * | 7/2002 | Hoenigschmid | 365/158 |
| 6,563,743 B2 * | 5/2003 | Hanzawa et al. | 365/189.02 |
| 6,618,317 B1 * | 9/2003 | Tsuji et al. | 365/230.07 |
| 6,760,244 B2 * | 7/2004 | Yamada | 365/63 |
| 6,760,251 B2 * | 7/2004 | Hidaka | 365/171 |
| 6,781,873 B2 * | 8/2004 | Ishikawa et al. | 365/158 |
| 6,788,571 B2 * | 9/2004 | Ooishi et al. | 365/171 |
| 6,791,887 B2 * | 9/2004 | Hung et al. | 365/189.09 |
| 6,809,976 B2 * | 10/2004 | Ooishi | 365/158 |
| 6,894,922 B1 * | 5/2005 | Hidaka | 365/158 |
| 6,943,420 B2 * | 9/2005 | Jeong | 257/422 |
| 6,946,882 B2 * | 9/2005 | Gogl et al. | 327/53 |
| 6,985,383 B2 * | 1/2006 | Tang et al. | 365/171 |
| 7,016,220 B2 * | 3/2006 | Lee et al. | 365/158 |
| 7,027,325 B2 * | 4/2006 | Iwata | 365/158 |
| 7,167,389 B2 * | 1/2007 | Iwata | 365/158 |
| 7,203,090 B2 | 4/2007 | Hayakawa | |
| 7,224,601 B2 | 5/2007 | Panchula | |
| 7,233,537 B2 * | 6/2007 | Tanizaki et al. | 365/209 |

(Continued)

FOREIGN PATENT DOCUMENTS
KR    1020030057489    7/2003
(Continued)

OTHER PUBLICATIONS

Notice of Allowance issued from Korean Intellectual Property Office on Aug. 31, 2011.

*Primary Examiner* — Viet Nguyen
(74) *Attorney, Agent, or Firm* — IP & T Group LLP

(57) ABSTRACT

A semiconductor memory device includes a plurality of memory cells configured to correspond to each of a plurality of word lines for storing data; a plurality of reference memory cells configured to include first and second magnetic memory devices, whose lower electrodes are commonly connected to each other, to generate a reference current corresponding to each of the memory cells; and a sense amplification unit configured to sense and amplify the reference current and a data current corresponding to a memory cell connected to an activated word line among the word lines.

25 Claims, 6 Drawing Sheets

U.S. PATENT DOCUMENTS

| | | | |
|---|---|---|---|
| 7,236,391 B2 * | 6/2007 | Liaw | 365/158 |
| 7,272,034 B1 * | 9/2007 | Chen et al. | 365/158 |
| 7,286,395 B2 | 10/2007 | Chen et al. | |
| 7,345,912 B2 * | 3/2008 | Luo et al. | 365/158 |
| 7,379,327 B2 | 5/2008 | Chen et al. | |
| 7,486,546 B2 * | 2/2009 | Wang et al. | 365/158 |
| 7,499,314 B2 * | 3/2009 | Yang et al. | 365/158 |
| 7,539,068 B2 * | 5/2009 | Wang et al. | 365/189.06 |
| 7,733,729 B2 * | 6/2010 | Boeve | 365/210.1 |
| 7,839,676 B2 * | 11/2010 | Kurose et al. | 365/171 |
| 7,881,098 B2 * | 2/2011 | Xi et al. | 365/158 |

FOREIGN PATENT DOCUMENTS

| | | |
|---|---|---|
| KR | 1020040029083 | 4/2004 |
| KR | 1020040077739 | 9/2004 |
| KR | 1020090026183 | 3/2009 |

\* cited by examiner

SEMICONDUCTOR MEMORY DEVICE

CROSS-REFERENCE TO RELATED APPLICATIONS

The present application claims priority of Korean patent application number 10-2009-0038532, filed on Apr. 30, 2009, which is incorporated by reference in its entirety.

BACKGROUND OF THE INVENTION

The present invention relates to a semiconductor design technology, and more particularly, to a reference memory cell for providing a reference current in a semiconductor memory device employing a Magnetic Tunnel Junction (MTJ) device.

Generally, it is known that Dynamic Random Access Memory (DRAM) and Static Random Access Memory (SRAM) devices that are volatile memory devices have a disadvantage where data stored in their memory cells can be lost when power is not supplied thereto. Thus, studies have been carried out to develop nonvolatile memory devices in recent years. One example of nonvolatile memory devices is a Magnetic Random Access Memory (MRAM) device that is a type of magnetic memory device. In particular, since the MRAM device has nonvolatile characteristics, achieves high integration and has high-speed operation and low power consumption characteristics, it has drawn a lot of attention as a next generation semiconductor memory device.

Each memory cell of the MRAM device may be composed of one transistor for performing a switching operation in response to an address provided from outside, and an MTJ device for storing data or information. The MTJ device, which is a type of magnetic memory device and has characteristics where MagnetoResistance (MR) varies depending on a magnetization direction of ferromagnetic, detects current by variations of MR to determine whether data stored in the MTJ device is '1' or '0'.

FIG. 1 is a circuit diagram illustrating the structure of a memory cell in a conventional semiconductor memory device.

Referring to FIG. 1, the memory cell includes one NMOS transistor 110 and one MTJ device 130.

The NMOS transistor 110 has a source-drain path formed between a source line SL and the MTJ device 130 and a gate connected to a word line WL, and is turned on or off depending on whether the word line WL is activated or deactivated. Here, the word line WL is selected by a row address.

The MTJ device 130 is composed of a free layer 132, a tunnel isolation layer 134, and a pinned layer 136. Here, the free layer 132 is made of ferromagnetic, in which its magnetization direction varies with an external stimulation (e.g., current transmitted to the MTJ device 130). But, the pinned layer 136 has a magnetization direction that does not vary although an external stimulation is applied. For reference, the pinned layer 136 has a fixed magnetization direction by a pinning layer (not shown) made of antiferromagnetic, and the tunnel isolation layer 134 may be formed of, for example, Magnesium Oxide (MgO) layer.

Such an MTJ device 130 has a tunneling current flowing depending on a certain voltage applied to its ends, in which the magnetization direction of the free layer 132 is determined depending on a direction of the tunneling current. If the magnetization direction of the free layer 132 is consistent with that of the pinned layer 136, the MTJ device 130 has a smaller resistance value, and if the magnetization direction of the free layer 132 is not consistent with that of the pinned layer 136, the MTJ device 130 has a greater resistance value (for example, a resistance value greater than the smaller resistance value). In general, if the magnetization direction of the free layer 132 is consistent with that of the pinned layer 136, data has '0', and if not, it has '1'.

In other words, in case where a positive voltage is applied to the free layer 132 to cause a positive current larger than a threshold current to flow therein, the magnetization direction of the free layer 132 becomes consistent with that of the pinned layer 136. Here, the positive voltage to the free layer 132 is greater than that to the pinned layer 136 by a certain amount. That is, a write operation of '0' data is performed and a resistance value of the MTJ device 130 becomes smaller. In contrast, in case where a negative voltage is applied to the free layer 132 to cause the negative current larger than a threshold current to flow therein, the magnetization direction of the free layer 132 becomes opposite to that of the pinned layer 136. Here, the positive voltage to the free layer 132 is greater than that to the pinned layer 136 by a certain amount. That is, a write operation of '1' data is performed and a resistance value of the MTJ device 130 becomes greater.

FIG. 2 shows characteristics of current and resistance that depend on temperature and voltage of the MTJ device 130 in FIG. 1.

As can be seen from FIG. 2, the MTJ device 130 has hysteresis, and also has two stable states depending on positive/negative currents above a threshold voltage, that is, a state with a smaller resistance value and a state with a larger resistance value. Such stable states continue to be maintained even with no power being applied.

FIG. 3 is a circuitry diagram illustrating the configuration of a conventional semiconductor memory device.

Referring to FIG. 3, the conventional semiconductor memory device includes a plurality of memory cells 310, a plurality of reference memory cells 320, a data current generation unit 330, a reference current generation unit 340, a sense amplification unit 350, a source line drive unit 360, a bit line drive unit 370, and first and second line drive units 380 and 390.

Each of the memory cells 310 serves to store data, and is provided with an NMOS transistor NM for performing a switching operation in response to an address, and an MTJ device for storing data, as described in FIG. 1. The memory cells 310 are configured to correspond to a plurality of word lines WL0, WL1, . . . , WLn, respectively, and are connected between a source line SL and a bit line BL. A data write operation of the memory cells 310 will be described later.

Each of the reference memory cells 320 generates a reference current I_REF and has the similar configuration to that of the memory cells 310, in which two reference memory cells is arranged in group to correspond to one word line. For illustration purposes, two reference memory cells corresponding to one word line will be referred to as a 'reference memory cell group' below. In general, two reference memory cells included in every reference memory cell group should have '1' data and '0' data stored therein, prior to producing semiconductor memory devices. That is, one reference memory cell should be an MTJ device RH having a larger resistance value, while the other reference memory cell should be an MTJ device having a smaller resistance value (e.g., a resistance smaller than the larger resistance value). The reason for storing '0' and '1' data with different polarities in every reference memory cell group is because the MTJ device has the characteristic shown in FIG. 2. Each of the reference memory cells 320 performs the operation of providing a reference current I_REF depending on the state of selected memory cell. A data write operation of the reference memory cells 320 will be described later.

The data current generation unit 330 generates a data current I_DAT corresponding to a memory cell selected by the word lines WL0, WL1, . . . , WLn, among the memory cells 310, and is composed of a current mirror. During a read operation, current corresponding to data stored in the selected memory cell flows in the bit line BL, in which an amount of the data current I_DAT is the same as that flowing in the bit line BL.

The reference current generation unit 340 generates a reference current I_REF corresponding to a reference memory cell group selected by the word lines WL0, WL1, . . . , WLn. Here, an amount of the reference current I_REF has half of an amount of current flowing in the selected reference memory cell group. That is, the reference current I_REF has half of a summed value of an amount of current flowing in the MTJ device RH with a larger resistance value and an amount of current flowing in the MTJ device RL with a smaller resistance value.

The sense amplification unit 350 senses and amplifies the data current I_DAT and the referent current I_REF. That is, the sense amplification unit 350 receives the fixed reference current I_REF of the reference memory cell group corresponding to the selected word line and the data current I_DAT varying depending on data in a memory cell corresponding to the selected word line, and compares them to output a comparison result. Then, based on the comparison result, the data stored in the memory cell can be determined from the outside.

The source line drive unit 360 and the bit line drive unit 370 drive the source line SL and the bit line BL depending on data to store desired data in corresponding memory cells, respectively. That is, the source line drive 360 drives the source line SL by a core voltage VCORE or ground voltage VSS depending on data, and the bit line drive 370 drives the bit line BL by the core voltage VCORE or ground voltage VSS depending on data.

Hereinafter, a data write operation of a memory cell will be briefly described. For illustration purposes, it is assumed that any one word line that corresponds to a memory cell where a write operation is performed, among the word lines WL0, WL1, . . . , WLn, is activated. During the write operation, a bit line selection signal BS is activated and the bit line BL is driven by the bit line drive unit 370.

First, during the write operation of '1' data, the source line drive unit 360 drives the source line SL by the core voltage VCORE, and the bit line drive unit 370 drives the bit line BL by the ground voltage VSS. Therefore, current flows from the source line SL to the bit line BL via the MTJ, so that the '1' data is stored in the memory cell, as described in FIG. 1.

Next, during the write operation of '0' data, the source line drive unit 360 drives the source line SL by the ground voltage VSS, and the bit line drive unit 370 drives the bit line BL by the core voltage VCORE. Therefore, current flows from the bit line BL to the source line SL via the MTJ, so that the '0' data is stored in the memory cell, as described in FIG. 1.

Meanwhile, the first and second line drive units 380 and 390 drive reference source and bit lines to store corresponding data in the reference memory cells 320. Specifically, the first line drive unit 380 drives a reference source line REF_SL by the core voltage VCORE or ground voltage VSS depending on data to be stored, and the second line drive unit 390 drives first and second reference bit lines REF_BL1 and REF_BL2 by the core voltage VCORE or ground voltage VSS depending on data to be stored.

Hereinafter, a data write operation of reference memory cells will be briefly described. For illustration purposes, it is assumed that any one of the word lines WL0, WL1, . . . , WLn is activated.

First, during the write operation of '1' data, a first drive control signal REF_H becomes logic 'high', and thus a first NMOS transistor NM1 is turned on. Meanwhile, the first line drive unit 380 drives the reference source line REF_SL by the core voltage VCORE, and the second line drive unit 390 drives the first reference bit line REF_BL1 by the ground voltage VSS. Therefore, current flows from the reference source line REF_SL to the first reference bit line REF_BL1 via the MTJ device RH, so that '1' data is stored in the MTJ device RH. That is, the MTJ device RH has a larger resistance value.

Next, during the write operation of '0' data, a second drive control signal REF_L becomes logic 'high', and thus a second NMOS transistor NM2 is turned on. Meanwhile, the first line drive unit 380 drives the reference source line REF_SL by the ground voltage VSS, and the second line drive unit 390 drives the second reference bit line REF_BL2 by the core voltage VCORE. Therefore, current flows from the second reference bit line REF_BL2 to the reference source line REF_SL via the MTJ device RL, so that '0' data is stored in the MTJ device RL. That is, the MTJ device RL has a smaller resistance value. 0028 The reference memory cells 320 have the MTJ device RH with a larger resistance value and the MTJ device RL with a smaller resistance value through the foregoing operation. In other words, in order to make the '1' data and '0' data stored in a reference memory cell group corresponding to one word line, the word line should be activated and the corresponding reference memory cell is selected by the first and second drive control signals REF_H and REF_L, and then the first and second line drive units 380 and 390 should be operated. For the following operation for storing '1' data and '0' data in another reference memory cell group, the foregoing operation should be repeated for the corresponding word line.

Meanwhile, as mentioned above, the reference memory cells 320 should have '1' data and '0' data written therein prior to producing the semiconductor memory device. The write operation of the reference memory cells 320 inevitably requires certain time and power consumption. If considerable time and power are required for storage of data in the memory cells 320, the semiconductor memory device incorporating them has competitive disadvantages.

SUMMARY OF THE INVENTION

Embodiments of the present invention are directed to providing a semiconductor memory device capable of decreasing the total number of magnetic memory devices provided in reference memory cells for providing a reference current.

In accordance with an embodiment of the present invention, there is provided a semiconductor memory device including a plurality of memory cells configured to correspond to each of a plurality of word lines for storing data; a plurality of reference memory cells configured to include first and second magnetic memory devices, whose lower electrodes are commonly connected to each other, to generate a reference current corresponding to each of the memory cells; and a sense amplification unit configured to sense and amplify the reference current and a data current corresponding to a memory cell connected to an activated word line among the word lines.

Each of the reference memory cells may further include a switching unit configured to correspond to the word line for establishing a current path having the first and second magnetic memory devices during a read operation.

The semiconductor memory may further include a reference current generation unit configured to be connected to the reference memory cells for providing the reference current to the sense amplification unit; and a data current generation unit configured to be connected to the memory cells for providing the data current to the sense amplification unit.

The first and second magnetic memory devices may have different data, respectively.

The semiconductor memory device may further include a drive unit configured to drive upper electrodes of the first and second magnetic memory devices by a given power in response to a write control signal.

The drive unit includes a first driver configured to drive an upper electrode of the first magnetic memory device by a first power in response to the write control signal; and a second driver configured to drive an upper electrode of the second magnetic memory device by a second power in response to the write control signal.

Each of the first and second magnetic memory devices may be a Magnetic Tunnel Junction (MTJ) device.

In accordance with another embodiment of the present invention, there is provided a semiconductor memory device including first and second memory cells configured to correspond to each of first and second word lines for storing data; a first reference memory cell configured to include a first magnetic memory device for storing data to generate a reference current corresponding to the first word line; a second reference memory cell configured to include a second magnetic memory device for storing data to generate the reference current corresponding to the second word line, wherein lower electrodes of the first and second magnetic memory devices are commonly connected to each other; and a sense amplification unit configured to sense and amplify a data current corresponding to a memory cell connected to an activated one of the first and second word lines, and the reference current corresponding to the first and second reference memory cells.

Each of the first and second reference memory cells may further include a switching unit configured to correspond to each of the first and second word lines for establishing a current path having the first and second magnetic memory devices during a read operation.

The semiconductor memory device may further includes a reference current generation unit configured to be connected to the first and second reference memory cells for providing the reference current to the sense amplification unit; and a data current generation unit configured to be connected to the first and second memory cells for providing the data current to the sense amplification unit.

The first and second magnetic memory devices may have different data, respectively.

The semiconductor memory device may further includes a drive unit configured to drive upper electrodes of the first and second magnetic memory devices by a given power in response to a write control signal.

The drive unit may include a first driver configured to drive an upper electrode of the first magnetic memory device by a first power in response to the write control signal; and a second driver configured to drive an upper electrode of the second magnetic memory device by a second power in response to the write control signal.

Each of the first and second magnetic memory devices may be a Magnetic Tunnel Junction (MTJ) device.

In accordance with another embodiment of the present invention, there is provided a semiconductor memory device including a memory cell configured to correspond to one word line for storing data; a reference memory cell configured to include first and second magnetic memory devices for storing data to generate a reference current corresponding to the word line, wherein lower electrodes of the first and second magnetic memory devices are commonly connected to each other; and a sense amplification unit configured to sense and amplify a data current corresponding to the memory cell when the word line is activated, and the reference current corresponding to the reference memory cell.

The reference memory cell may further include a switching unit configured to correspond to the word line for establishing a current path having the first and second magnetic memory devices during a read operation.

The semiconductor memory device may further include a reference current generation unit configured to be connected to the reference memory cell for providing the reference current to the sense amplification unit; and a data current generation unit configured to be connected to the memory cell for providing the data current to the sense amplification unit.

The first and second magnetic memory devices may have different data, respectively.

The semiconductor memory device may further including a drive unit configured to drive upper electrodes of the first and second magnetic memory devices by a given power in response to a write control signal.

The drive unit may include a first driver configured to drive an upper electrode of the first magnetic memory device by a first power in response to the write control signal; and a second driver configured to drive an upper electrode of the second magnetic memory device by a second power in response to the write control signal.

Each of the first and second magnetic memory devices may be a Magnetic Tunnel Junction (MTJ) device.

In accordance with another embodiment of the present invention, there is provided a semiconductor memory device including: a memory cell configured to correspond to first and second word lines for storing data; a first reference memory cell configured to include a first magnetic memory device for storing data to generate a reference current corresponding to the first and second word lines, wherein lower electrodes of the first magnetic memory device and a second magnetic memory device included in its adjacent second reference memory cell are commonly connected to each other; and a sense amplification unit configured to sense and amplify a data current corresponding to the memory cell when the first and second word lines are activated, and the reference current corresponding to the first and second reference memory cells.

The first and second word lines may be activated in response to a same address.

Each of the first and second reference memory cells may further include a switching unit configured to correspond to a corresponding one of the first and second word lines for establishing a current path having the first and second magnetic memory devices during a read operation.

The semiconductor memory device may further include a reference current generation unit configured to be connected to the first and second reference memory cells for providing the reference current to the sense amplification unit; and a data current generation unit configured to be connected to the memory cell for providing the data current to the sense amplification unit.

The first and second magnetic memory devices may have different data, respectively.

The semiconductor memory device may further includes a drive unit configured to drive upper electrodes of the first and second magnetic memory devices by a given power in response to a write control signal.

The drive unit may include a first driver configured to drive an upper electrode of the first magnetic memory device by a first power in response to the write control signal; and a second driver configured to drive an upper electrode of the second magnetic memory device by a second power in response to the write control signal.

Each of the first and second magnetic memory devices may be a Magnetic Tunnel Junction (MTJ) device.

The present invention can reduce the total number of magnetic memory devices provided in a plurality of reference memory cells. Accordingly, the present invention can reduce a chip size of the semiconductor memory device, thereby decreasing time and power consumed during the write operation of the reference memory cells.

DESCRIPTION OF SPECIFIC EMBODIMENTS

Other objects and advantages of the present invention can be understood by the following description, and become apparent with reference to the embodiments of the present invention.

Hereinafter, preferred embodiments of the present invention will be described in detail with reference to the accompanying drawings so that the invention can be easily practiced by those skilled in the art to which the invention pertains.

Figure 4:
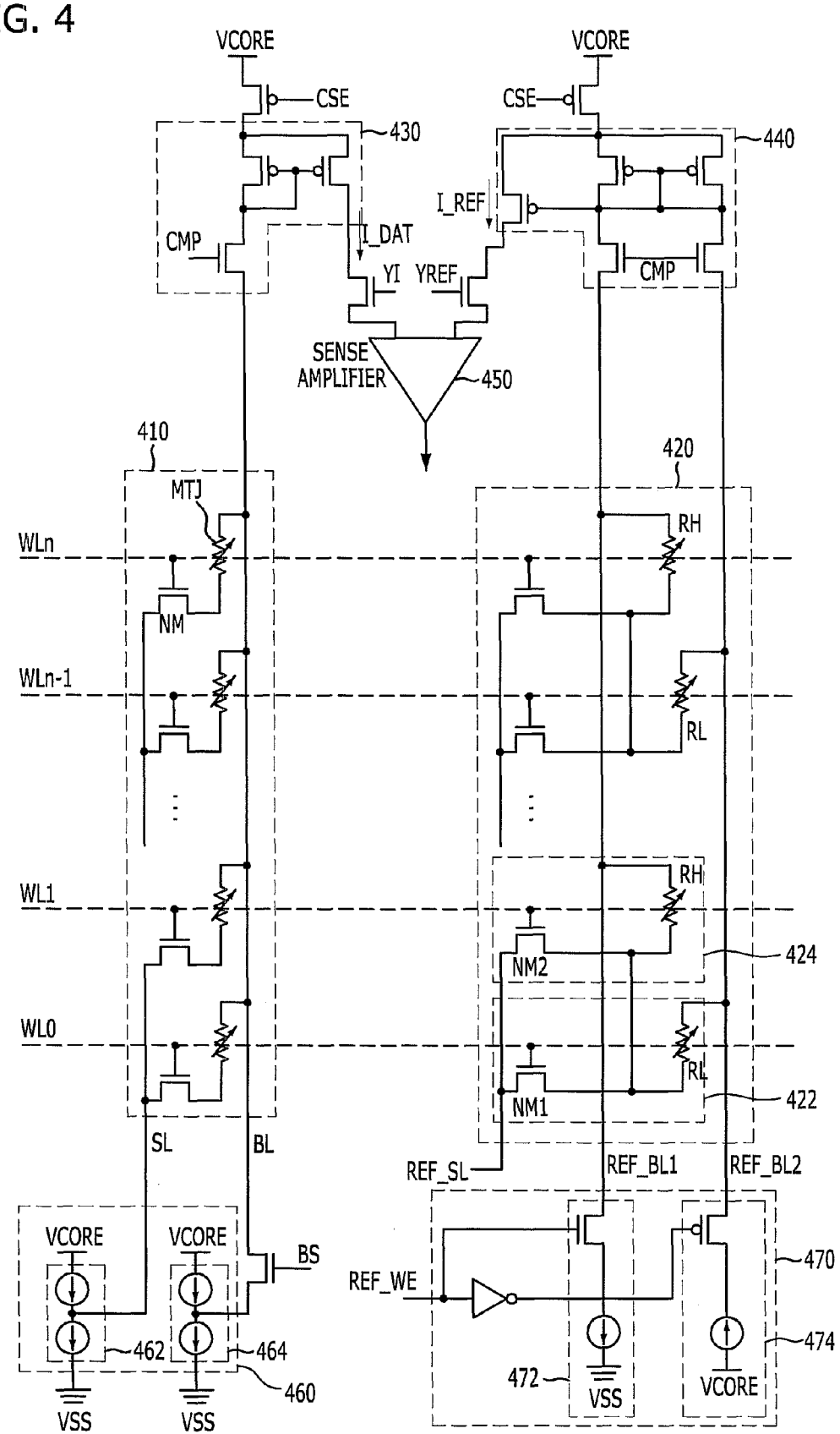
FIG. 4 is a circuit diagram illustrating the configuration of a semiconductor memory device in accordance with a first embodiment of the present invention.

FIG. 4 is a circuit diagram illustrating the configuration of a semiconductor memory device in accordance with a first embodiment of the present invention.

Referring to FIG. 4, the semiconductor memory device includes a plurality of memory cells 410, a plurality of reference memory cells 420, a data current generation unit 430, a reference current generation unit 440, a sense amplification unit 450, a memory cell write drive unit 460, and a reference cell write drive unit 470.

Each of the memory cells 410 serves to store data, and is provided with an NMOS transistor NM for performing a switching operation in response to an address, and an MTJ device for storing data. The memory cells 410 are configured to correspond to a plurality of word lines WL0, WL1, ..., WLn, respectively, and are connected between a source line SL and a bit line BL. A data write operation and a data read operation of the memory cells 410 will be described below.

Each of the reference memory cells 420 generates a reference current I_REF, and has a structure in which lower electrodes of an MTJ device RH where '1' data is stored and of an MTJ device RL where '0' data is stored are commonly connected to each other. In other words, a first reference memory cell 422 corresponding to a zeroth word line WL0 is provided with a first NMOS transistor NM1 which is turned on when the zeroth word line WL0 is activated, and an MTJ device RL where '0' data is stored, that is, having a smaller resistance value. Similarly, a second reference memory cell 424 corresponding to a first word line WL1 is provided with a second NMOS transistor NM2 which is turned on when the first word line WL1 is activated, and an MTJ device RH where '1' data is stored, that is, having a larger resistance value. Here, an upper electrode of the MTJ device RH with a larger resistance value is connected to the first reference bit line REF_BL1, and an upper electrode of the MTJ device RL with a smaller resistance value is connected to the second reference bit line REF_BL2, while the lower electrodes of the MTJ device RH with a larger resistance value and of the MTJ device RL with a smaller resistance value are commonly connected to each other. A data write operation of the reference memory cells 420 will be described below.

The data current generation unit 430 is composed of a current mirror for providing a data current I_DAT corresponding to a memory cell selected by the word lines WL0, WL1, ..., WLn, among the memory cells 410. During a read operation, current corresponding to data stored in the selected memory cell flows in the bit line BL. Through this configuration, an amount of the data current I_DAT becomes identical to an amount of current flowing in the bit line BL.

The reference current generation unit 440 generates a reference current I_REF corresponding to a reference memory cell selected by the word lines WL0, WL1, ..., WLn. Here, an amount of the reference current I_REF has half of an amount of current flowing in a reference memory cell corresponding to a selected word line. That is, the reference current I_REF has half of a summed value of the amount of current flowing in the MTJ device RH with a larger resistance value and the amount of current flowing in the MTJ device RL with a smaller resistance value.

The sense amplification unit 450 senses and amplifies the data current I_DAT and the reference current I_REF. That is, the sense amplification unit 450 receives and compares the reference current I_REF fixed by the MTJ device RH with a larger resistance value and the MTJ device RL with a smaller resistance value, which correspond to a selected word line, and the data current I_DAT varying depending on data in the memory cell corresponding to the selected word line. Thus, based on the comparison result, the data stored in the memory cell can be determined from the outside.

The memory cell write drive unit 460 serves to drive the source line SL and the bit line BL in response to data, and is provided with a source line driver 462 and a bit line driver 464. The source line driver 462 drives the source line SL by the core voltage VCORE or ground voltage VSS in response to data, and the bit line driver 464 drives the bit line BL by the core voltage VCORE or ground voltage VSS in response to data.

Hereinafter, a data write operation of a memory cell will be briefly described. For illustration purposes, it is assumed that any one word line that corresponds to a memory cell where a write operation is conducted among the word lines WL0, WL1, ..., WLn is activated. During the write operation, a bit line selection signal BS is activated and the bit line BL is driven by the bit line driver 464.

First, during the write operation of '1' data, the source line driver 462 drives the source line SL by the core voltage VCORE, and the bit line driver 464 drives the bit line BL by the ground voltage VSS. Therefore, current flows from the source line SL to the bit line BL via the MTJ device, so that '1' data is stored in the memory cell.

Next, during the write operation of '0' data, the source line driver 462 drives the source line SL by the ground voltage VSS, and the bit line driver 464 drives the bit line BL by the core voltage VCORE. Therefore, current flows from the bit line BL to the source line SL via the MTJ device, so that '0' data is stored in the memory cell.

Hereinafter, a data read operation of memory cells will be briefly described. For illustration purposes, it is assumed that the first word line WL1 is activated.

First, when the first word line WL1 is activated, a third NMOS transistor NM3 of the corresponding memory cell is turned on, so that the data current I_DAT flows depending on data stored in the MTJ device of the corresponding memory cell. If the data stored in the MTJ device is '1', this means that the resistance value of the MTJ device is larger, and thus the data current I_DAT becomes smaller. If the data stored in the MTJ device is '0', this means that the resistance value of the MTJ device is smaller, and thus the data current I_DAT becomes larger than when the data in the MTJ device is '1'. For reference, a current control signal CMP and a current activation signal CSE are activated during the read operation. Further, a cell selection signal YI is activated in response to a column address and a reference cell activation signal YREF is activated to deliver the reference current I_REF to the sense amplification unit 450 during the read operation.

Meanwhile, when the first word line WL1 is activated, the second NMOS transistor NM2 of the second reference memory cell 424 is turned on and thus current flows into the reference source line REF_SL via the MTJ device RH with a larger resistance value. At this time, since a lower electrode of the MTJ device RH with a larger resistance value is connected to a lower electrode of the MTJ device RL with a smaller resistance value, current flows into the reference source line REF_SL via the MTJ device RL with a smaller resistance value. As a result, the current flows through the MTJ device RH with a larger resistance value arranged to correspond to the first word line and the MTJ device RL with a smaller resistance value arranged to correspond to the zeroth word line, so that the reference current generation unit 440 generates the reference current I_REF having half of a summed value of the amount of current flowing in the MTJ device RH with a larger resistance value and the amount of current flowing in the MTJ device RL with a smaller resistance value.

The sense amplification unit 450 senses and amplifies the data current I_DAT of a memory cell selected correspondingly to the first word line WL1, and the reference current I_REF of the MTJ device RH with a larger resistance value and of the MTJ device RL with a smaller resistance value, selected correspondingly to the first word line WL1. Through this process, the semiconductor memory device performs the read operation.

Figure 1:
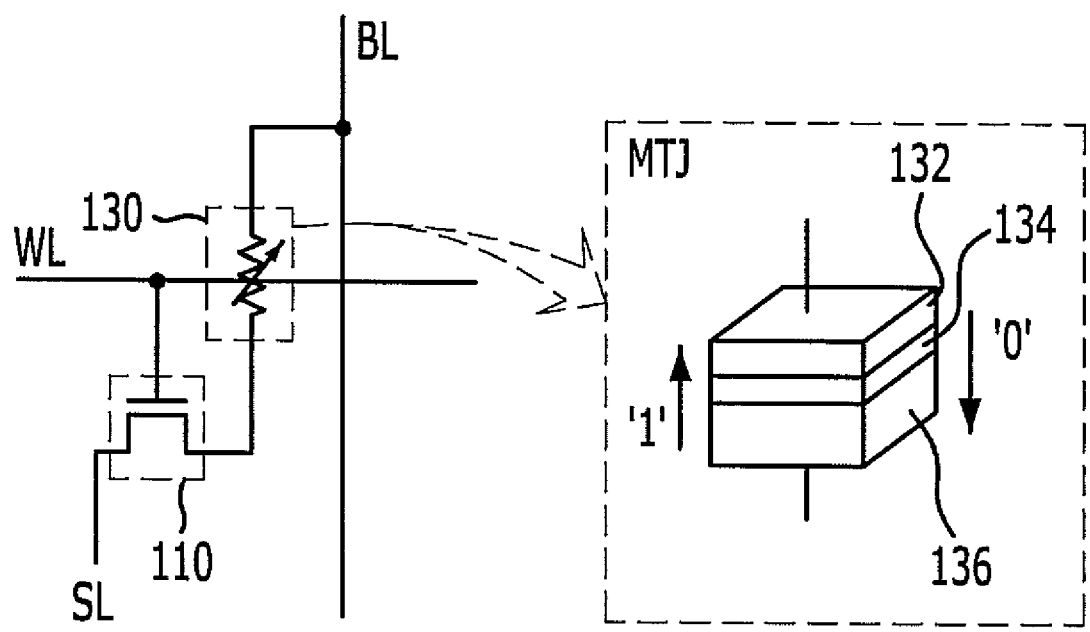
FIG. 1 is a circuit diagram illustrating the structure of a memory cell in a conventional semiconductor memory device.
Figure 2:
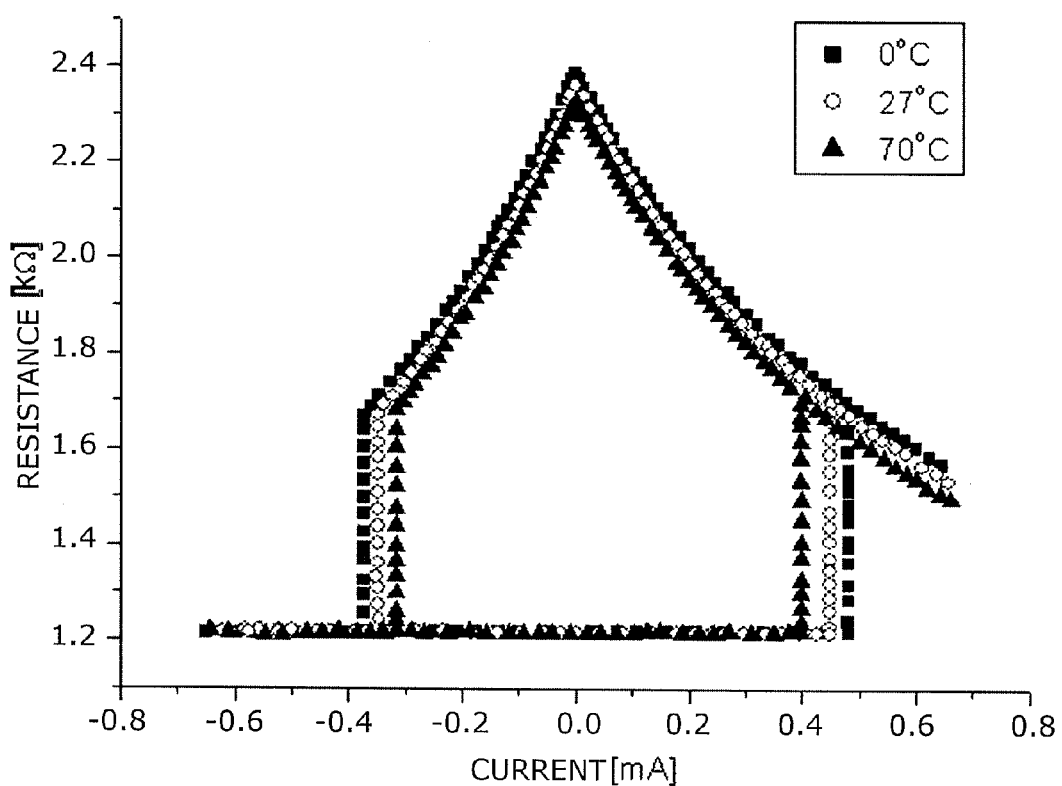
FIG. 2 shows characteristics of current and resistance that depend on temperature and voltage of the MTJ device 130 depicted in FIG. 1.
Figure 3:
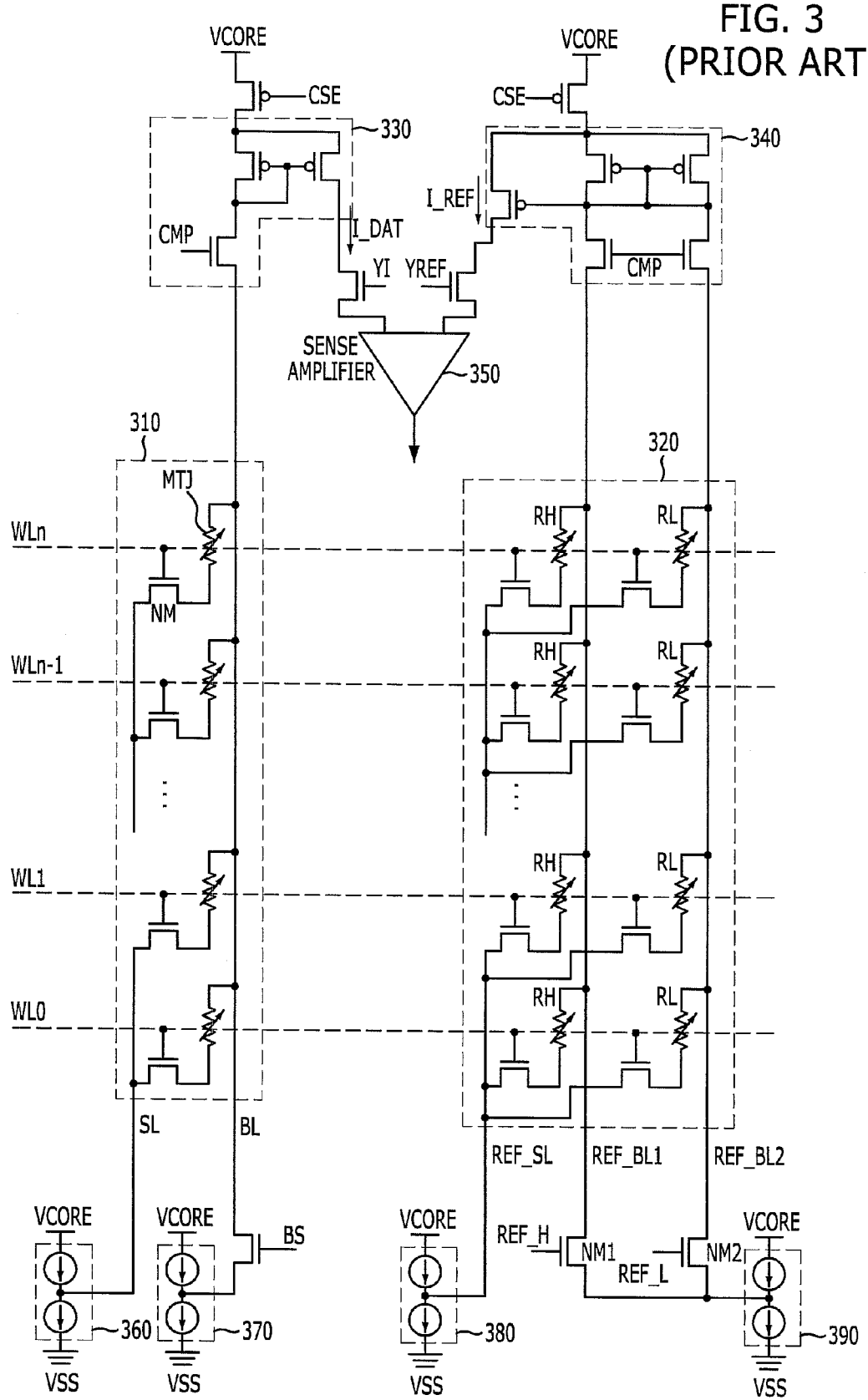
FIG. 3 is a circuitry diagram illustrating the configuration of a conventional semiconductor memory device.

The conventional configuration as illustrated in FIG. 3 includes two NMOS transistors and two MTJ devices RH and RL for one word line to generate the reference current I_REF. In contrast, the present invention includes one NMOS transistor and one MTJ device for one word line, and another MTJ device between itself and its adjacent word line, as depicted in FIG. 4. That is, the semiconductor memory device in accordance with the present invention not only generates the same reference current I_REF, but also reduces an area occupied by the reference memory cells 420 compared to the conventional memory device. For reference, even when the zeroth word line WL0 is activated, the reference current I_REF, which corresponds to current flowing in the MTJ device RH with a larger resistance value and the MTJ device with a smaller resistance value in the first and second reference memory cells 422 and 424, can be generated.

Meanwhile, the reference cell write drive unit 470 is provided with a first line driver 472 and a second line driver 474 to store corresponding data in the reference memory cells 420.

The first line driver 472 drives a first reference bit line REF_BL1 by the ground voltage VSS in response to a reference cell write control signal REF_WE, and the second line driver 474 drives a second reference bit line REF_BL2 by the core voltage VCORE in response to the reference cell write control signal REF_WE. Here, the reference cell write control signal REF_WE is activated at an interval when corresponding data is stored in the reference memory cells 420.

Hereinafter, a data write operation of the reference memory cells will be briefly described. For reference, the current control signal CMP and the current activation signal CSE are deactivated at an interval when data is stored in the reference memory cells 420, and the reference memory cells 420 of the present invention do not require their corresponding word lines to be controlled differently from the conventional memory device. Thus, the operation of storing data in the reference memory cells 420 can be simplified.

First, the NMOS transistor corresponding to the first and second reference bit lines REF_BL1 and REF_BL2 is turned on in response to the reference cell write control signal REF_WE. Then, the second reference bit line REF_BL2 is driven by the core voltage VCORE and the first reference bit line REF_BL1 is driven by the ground voltage VSS. At this time, current flows in all of the MTJ devices of the reference memory cells 420.

In this regard, the first and second reference memory cells 422 and 424 will be described as an example. First, the second reference bit line REF_BL2 is driven by the core voltage VCORE, and the first reference bit line REF_BL1 is driven by the ground voltage VSS. That is, the MTJ device RL of the first reference memory cell 422 has a path where current flows from the second reference bit line REF_BL2 to a common lower electrode, and the MTJ device RH of the second reference memory cell 424 has a path where current flows from the common lower electrode to the first reference bit line REF_BL1. Therefore, '0' data is stored in the first reference memory cell 422 and '1' data is stored in the second memory cell 424. That is to say, the MTJ device RL of the first reference memory cell 422 has a smaller resistance value and the MTJ device RH of the second reference memory cell 424 has a larger resistance value.

The conventional semiconductor memory device requires considerable time and power consumed to store data in the reference memory cells, as set forth in FIG. 3, and causes inconvenience in the write operation of storing respective data in corresponding MTJ devices, e.g., the drive control operation of the first and second reference bit lines corresponding to the word line control operation and the corresponding data. This acts as a disadvantage in terms of product competitiveness of the semiconductor memory device. However, the present invention can store desired data in the reference memory cells at a time, thereby reducing time and power consumed compared to the conventional device and minimizing an inconvenience in the write operation of the reference memory cells 420.

Figure 5:
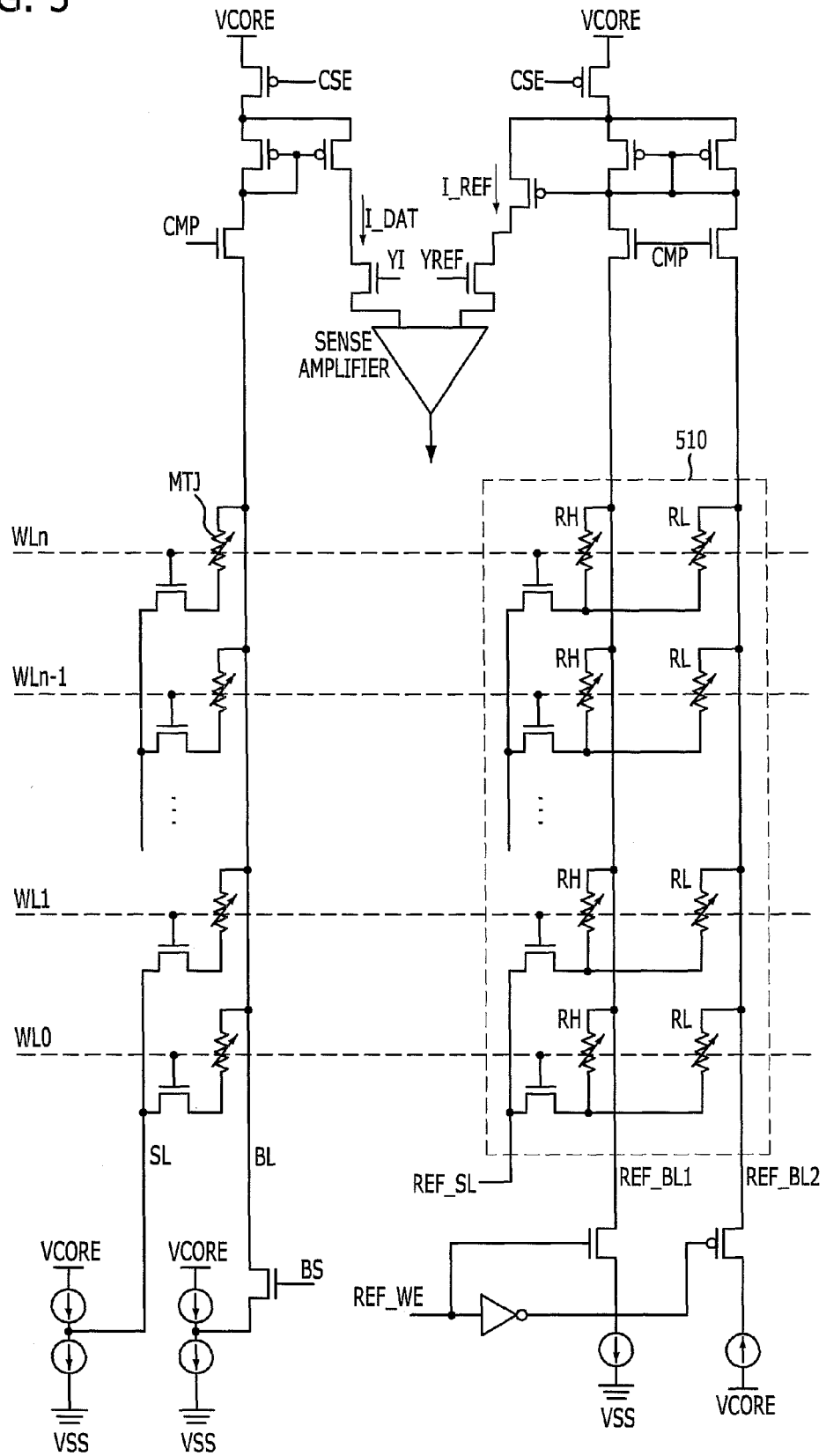
FIG. 5 is a circuit diagram illustrating the configuration of a semiconductor memory device in accordance with a second embodiment of the present invention.

FIG. 5 is a circuit diagram illustrating the configuration of a semiconductor memory device in accordance with a second embodiment of the present invention, in which a plurality of reference memory cells 510 has a different structure from that of the first embodiment shown in FIG. 4.

Referring to FIG. 5, each of the reference memory cells 510 is composed of one NMOS transistor and two MTJ devices RH and RL arranged to correspond to one word line. Here, an upper electrode of the MTJ device RH with a larger resistance value is connected to a first reference bit line REF_BL1 and an upper electrode of the MTJ device RL with a smaller resistance value is connected to a second reference bit line REF_BL2, in which lower electrodes of the MTJ device RH with a larger resistance value the MTJ device RL with a smaller resistance value are commonly connected to each other.

In the second embodiment, an amount of the reference current I_REF is determined by the MTJ device RH with a larger resistance value and the MTJ device with a smaller resistance value, which correspond to an activated word line. The reference current I_REF so generated is used as a reference to determine data during the read operation of the semiconductor memory device, as in the first embodiment.

In addition, the second embodiment can store desired data in the MTJ devices RH and RL provided in the reference memory cells 510 at a time, as in the first embodiment. That is, when the second reference bit line REF_BL2 is driven by the core voltage VCORE and the first reference bit line REF_BL1 is driven by the ground voltage VSS in response to a reference cell write control signal REF_WE, each of the reference memory cells has a path in which current flows from the second reference bit line REF_BL2 to a common lower electrode of the MTJ device RL whose upper electrode is connected to the second reference bit line REF_BL2 via the MTJ device RL, and then flows from the common lower electrode to the first reference bit line REF_BL1 via the MTJ device RH whose upper s electrode is connected to the first reference bit line REF_BL1. Therefore, '0' data and '1' data are stored in the corresponding MTJ devices RH and RL of the reference memory cells 510. That is, the MTJ device RH with a larger resistance value and the MTJ device RL with a smaller resistance value are formed.

As can be seen from the drawing, the second embodiment of the invention can reduce one NMOS transistor for each of the reference memory cells compared to the existing configuration, and also can store desired data in the MTJ devices included in the reference memory cells.

Figure 6:
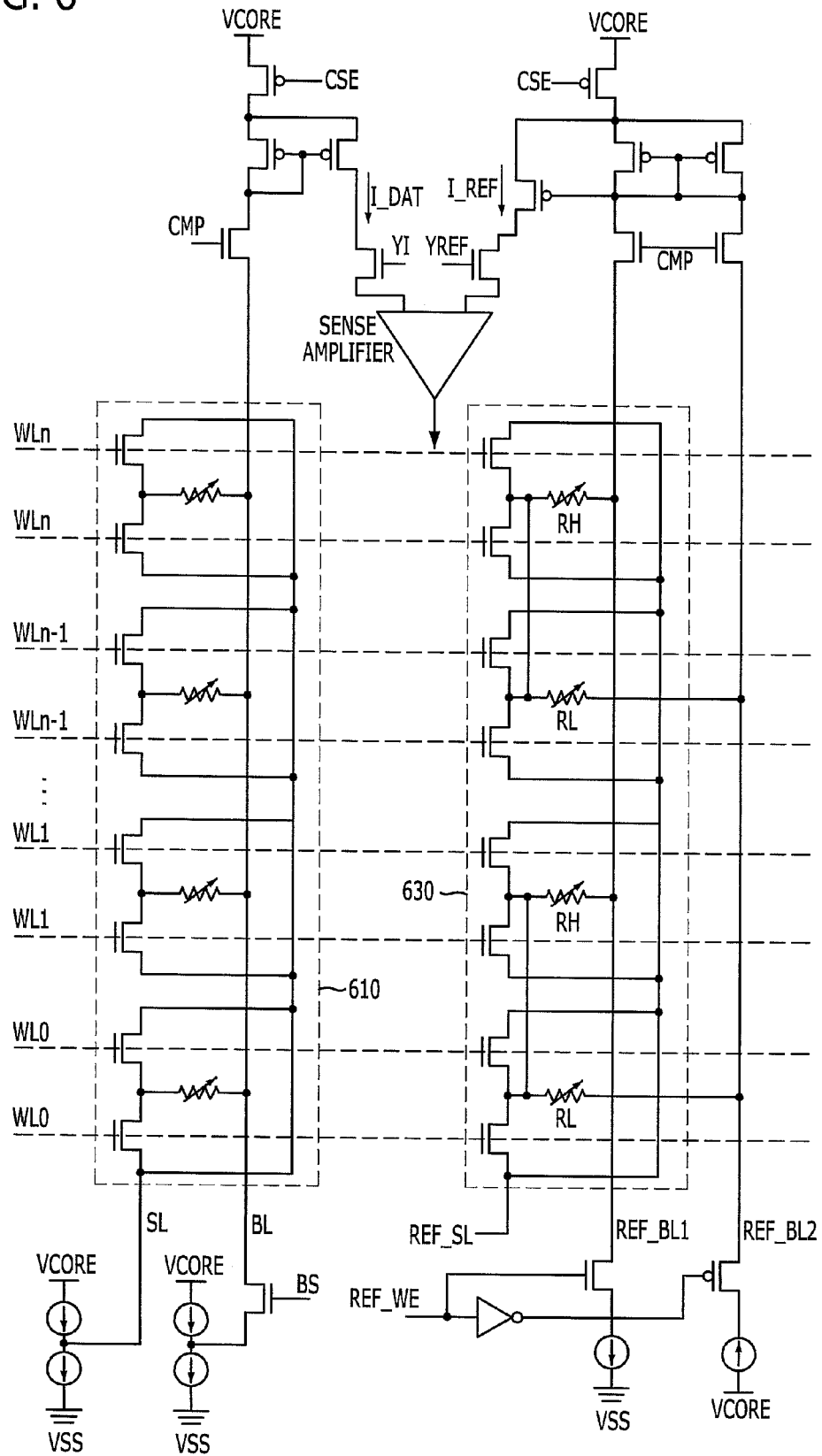
FIG. 6 is a circuit diagram illustrating the configuration of a semiconductor memory device in accordance with a third embodiment of the present invention.

FIG. 6 is a circuit diagram illustrating the configuration of a semiconductor memory device in accordance with a third embodiment of the present invention. When comparing with the first and second embodiments, the third embodiment has a plurality of memory cells 610 with modified structures and thus has a plurality of reference memory cells 630 with modified structures.

Referring to FIG. 6, the memory cells 610 have one memory cell arranged for two word lines, and the reference memory cells 630 have one reference memory cell for two word lines. Here, the MTJ device RH with a larger resistance value and the MTJ device RL with a smaller resistance value share their own lower electrodes.

In the third embodiment, an amount of the reference current I_REF is determined by the MTJ device RH with a larger resistance value and the MTJ device with a smaller resistance value, which correspond to activated two word lines. In addition, similar to the first and second embodiments, the third embodiment can store desired data in the MTJ devices RH and RL provided in the reference memory cells 610 at a time. That is, when the second reference bit line REF_BL2 is driven by the core voltage VCORE and the first reference bit line REF_BL1 is driven by the ground voltage VSS in response to a reference cell write control signal REF_WE, each of the reference memory cells has a path in which current flows from the second reference bit line REF_BL2 to a common lower electrode of the MTJ device RL whose upper electrode is connected to the second reference bit line REF_BL2 via the MTJ device RL, and then flows from the common lower electrode to the first reference bit line REF_BL1 via the MTJ device RH whose upper electrode is connected to the first reference bit line REF_BL1. Therefore, '0' data and '1' data are stored in the corresponding MTJ devices RH and RL of the reference memory cells 610. That is, the MTJ device RH with a larger resistance value and the MTJ device RL with a smaller resistance value are formed.

As described above, the semiconductor memory device in accordance with the present invention can minimize the number of the MTJ device RH with a larger resistance value and the MTJ device RL with a smaller resistance value provided in the reference memory cells for providing the reference current I_REF, and thus can reduce a chip size of the memory device. As can be seen from the configurations of the first to third embodiments, the reference memory cells allow desired data to store in the corresponding MTJ devices through a single write operation, thereby minimizing time and power consumed to form the MTJ device RH with a larger resistance value and the MTJ device RL with a smaller resistance value and an inconvenience in executing the write operation to do so. As a result, the semiconductor memory device in accordance with the present invention can improve its product competitiveness.

It should be noted that the logic gates and transistors illustrated in the embodiments set forth above may be arranged in different places and implemented in different types based on polarities of input signals.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
    a plurality of memory cells configured to correspond to each of a plurality of word lines for storing data;
    a plurality of reference memory cells configured to include first and second magnetic memory devices, whose lower electrodes are commonly connected to each other, to generate a reference current corresponding to each of the memory cells;
    a sense amplification unit configured to sense and amplify the reference current and a data current corresponding to a memory cell connected to an activated word line among the word lines; and
    a drive unit configured to drive upper electrodes of the first and second magnetic memory devices by a given power in response to a write control signal.

2. The semiconductor memory device as recited in claim 1, wherein each of the reference memory cells further includes a switching unit configured to correspond to the word line for establishing a current path having the first and second magnetic memory devices during a read operation.

3. The semiconductor memory device as recited in claim 1, further comprising:
    a reference current generation unit configured to be connected to the reference memory cells for providing the reference current to the sense amplification unit; and
    a data current generation unit configured to be connected to the memory cells for providing the data current to the sense amplification unit.

4. The semiconductor memory device as recited in claim 1, wherein the first and second magnetic memory devices have different data, respectively.

5. The semiconductor memory device as recited in claim 1, wherein the drive unit includes:
    a first driver configured to drive the upper electrode of the first magnetic memory device by a first power in response to the write control signal; and a second driver configured to drive the upper electrode of the second magnetic memory device by a second power in response to the write control signal.

6. The semiconductor memory device as recited in claim 1, wherein each of the first and second magnetic memory devices is a magnetic tunnel junction (MTJ) device.

7. A semiconductor memory device, comprising:
a first and second memory cells configured to correspond to each of first and second word lines for storing data;
a first reference memory cell configured to include a first magnetic memory device for storing data to generate a reference current corresponding to the first word line;
a second reference memory cell configured to include a second magnetic memory device for storing data to generate the reference current corresponding to the second word line, wherein lower electrodes of the first and second magnetic memory devices are commonly connected to each other;
a sense amplification unit configured to sense and amplify a data current corresponding to a memory cell connected to an activated one of the first and second word lines, and the reference current corresponding to the first and second reference memory cells; and
a drive unit configured to drive upper electrodes of the first and second magnetic memory devices by a given power in response to a write control signal.

8. The semiconductor memory device as recited in claim 7, wherein each of the first and second reference memory cells further includes a switching unit configured to correspond to each of the first and second word lines for establishing a current path having the first and second magnetic memory devices during a read operation.

9. The semiconductor memory device as recited in claim 7, further comprising:
a reference current generation unit configured to be connected to the first and second reference memory cells for providing the reference current to the sense amplification unit; and
a data current generation unit configured to be connected to the first and second memory cells for providing the data current to the sense amplification unit.

10. The semiconductor memory device as recited in claim 7, wherein the first and second magnetic memory devices have different data, respectively.

11. The semiconductor memory device as recited in claim 7, wherein the drive unit includes:
a first driver configured to drive the upper electrode of the first magnetic memory device by a first power in response to the write control signal; and
a second driver configured to drive the upper electrode of the second magnetic memory device by a second power in response to the write control signal.

12. The semiconductor memory device as recited in claim 7, wherein each of the first and second magnetic memory devices is a magnetic tunnel junction (MTJ) device.

13. A semiconductor memory device, comprising:
a memory cell configured to correspond to one word line for storing data;
a reference memory cell configured to include first and second magnetic memory devices for storing data to generate a reference current corresponding to the word line, wherein lower electrodes of the first and second magnetic memory devices are commonly connected to each other;
a sense amplification unit configured to sense and amplify a data current corresponding to the memory cell when the word line is activated, and the reference current corresponding to the reference memory cell; and
a drive unit configured to drive upper electrodes of the first and second magnetic memory devices by a given power in response to a write control signal.

14. The semiconductor memory device as recited in claim 13, wherein the reference memory cell further includes a switching unit configured to correspond to the word line for establishing a current path having the first and second magnetic memory devices during a read operation.

15. The semiconductor memory device as recited in claim 13, further comprising:
a reference current generation unit configured to be connected to the reference memory cell for providing the reference current to the sense amplification unit; and
a data current generation unit configured to be connected to the memory cell for providing the data current to the sense amplification unit.

16. The semiconductor memory device as recited in claim 13, wherein the first and second magnetic memory devices have different data, respectively.

17. The semiconductor memory device as recited in claim 13, wherein the drive unit includes:
a first driver configured to drive the upper electrode of the first magnetic memory device by a first power in response to the write control signal; and
a second driver configured to drive the upper electrode of the second magnetic memory device by a second power in response to the write control signal.

18. The semiconductor memory device as recited in claim 13, wherein each of the first and second magnetic memory devices is a magnetic tunnel junction (MTJ) device.

19. A semiconductor memory device, comprising:
a memory cell configured to correspond to first and second word lines for storing data;
a first reference memory cell configured to include a first magnetic memory device for storing data to generate a reference current corresponding to the first and second word lines, wherein lower electrodes of the first magnetic memory device and a second magnetic memory device included in its adjacent second reference memory cell are commonly connected to each other;
a sense amplification unit configured to sense and amplify a data current corresponding to the memory cell when the first and second word lines are activated, and the reference current corresponding to the first and second reference memory cells; and
a drive unit configured to drive upper electrodes of the first and second magnetic memory devices by a given power in response to a write control signal.

20. The semiconductor memory device as recited in claim 19, wherein the first and second word lines are activated in response to a same address.

21. The semiconductor memory device as recited in claim 19, wherein each of the first and second reference memory cells further includes a switching unit configured to correspond to a corresponding one of the first and second word lines for establishing a current path having the first and second magnetic memory devices during a read operation.

22. The semiconductor memory device as recited in claim 19, further comprising:
a reference current generation unit configured to be connected to the first and second reference memory cells for providing the reference current to the sense amplification unit; and
a data current generation unit configured to be connected to the memory cell for providing the data current to the sense amplification unit.

23. The semiconductor memory device as recited in claim 19, wherein the first and second magnetic memory devices have different data, respectively.

24. The semiconductor memory device as recited in claim 19, wherein the drive unit includes:
- a first driver configured to drive the upper electrode of the first magnetic memory device by a first power in response to the write control signal; and
- a second driver configured to drive the upper electrode of the second magnetic memory device by a second power in response to the write control signal.

25. The semiconductor memory device as recited in claim 19, wherein each of the first and second magnetic memory devices is a magnetic tunnel junction (MTJ) device.

* * * * *